United States Patent
Komiya

[19]
[11] Patent Number: 6,100,771
[45] Date of Patent: Aug. 8, 2000

[54] MULTI-SIGNAL GENERATOR

[75] Inventor: Hiroshi Komiya, Gyoda, Japan

[73] Assignee: Advantest Corp., Tokyo, Japan

[21] Appl. No.: 09/180,197

[22] PCT Filed: Apr. 16, 1998

[86] PCT No.: PCT/JP96/01739

§ 371 Date: Oct. 18, 1999

§ 102(e) Date: Oct. 18, 1999

[87] PCT Pub. No.: WO98/49568

PCT Pub. Date: Nov. 5, 1998

[30] Foreign Application Priority Data

Apr. 25, 1997 [JP] Japan ................................. 9-108460

[51] Int. Cl.⁷ .............. H03C 3/00; H04B 17/00; H04L 27/00
[52] U.S. Cl. .............. 332/103; 332/119; 332/151; 455/67.4; 455/103; 455/104; 375/224
[58] Field of Search ................. 331/38; 332/100–105, 332/117, 119, 149, 151; 324/619; 455/59, 67.4, 103–104, 226.1–226.4

[56] References Cited

U.S. PATENT DOCUMENTS 5,659,891  8/1997  Hays et al. ................. 455/103

*Primary Examiner*—David Mis
*Attorney, Agent, or Firm*—Muramatsu & Associates

[57] ABSTRACT

It is to provide a multi-signal generator which is able to lower the cost thereof by performing modulation in a low frequency range and using an output of a frequency synthesizer commonly to all channels. The multi-signal generator for generating a multi-signal which is a combination of a plurality of output signals generated by a plurality of channels each of which is using a frequency conversion method wherein a modulated carrier signal and a local signal are frequency converted by a mixer, wherein an output frequency from at least one frequency synthesizer is commonly used as a frequency source for the carrier signal or local signal by all the channels.

5 Claims, 6 Drawing Sheets

MULTI-SIGNAL GENERATOR

TECHNICAL FIELD

This invention relates to a multi-signal generator used for testing receivers of mobile communication systems.

BACKGROUND ART

An example of conventional technology is explained with reference to FIGS. 5 and 6.

A multi-signal generator used for testing receivers of mobile communication systems outputs signals having multiple frequencies by adding a plurality of signals corresponding to the requirements of testing.

The configuration and its function of such a conventional technology are explained in the case where a multi-signal generator of three channels generates signals having three different frequencies.

As shown in FIG. 5, a multi-signal generator 1 in the conventional technology has a three-channel configuration and includes frequency synthesizers 11, 12, and 13, modulators 21, 22, and 23, amplifiers 71, 72, and 73, and attenuators 81, 82, and 83. The multi-signal generator 1 also includes an adder 90.

Each of the components and functions is explained in the following:

The frequency synthesizer 11 in the channel 1 is a variable frequency synthesizer in the frequency range of 0–2 GHz, and generates a frequency f1 as a carrier signal.

The modulator 21 is a mobile communication modulator used in a mobile communication system such as a quadrature modulator.

The quadrature modulator modulates an amplitude and phase of a carrier signal by an I channel and an Q channel of the base band signal.

Namely, the same phase (I: In Phase) components of the carrier signal is modulated by the binary data of an I channel base band signal, and the 90-degree phase shifted (Q : Quadrature Phase) components is modulated by the binary data of a Q channel base band signal, and then both modulated components are combined with one another to be output as a modulated carrier signal.

The modulated carrier signal is amplified by the amplifier 71 and is attenuated to a desired power level by the attenuator 81. Thus, the signal frequency f1 which is in the range of 0–2 GHz with a desired power level is output to the adder 90 as an output signal of the channel 1.

In the similar manner, an output signal of channel 2 and an output signal of channel 3 are provided to the adder 90.

These signals of three channels are combined by the adder 90 which outputs a signal having frequencies f1, f2, and f3 in the frequency range of 0–2 GHz.

In this example, however, when frequency variable synthesizers of wide frequency range and quadrature modulators are used, depending on frequency settings in the output signals, calibration processes become necessary to suppress spurious responses at the output of quadrature modulators by fine adjusting amplitudes and phases of the base band signals to modulate the carrier signals or several additional quadrature modulators must be provided.

In other words, in this method, the circuit configuration needs to be complex because the wide range frequencies are applied to the quadrature modulators.

Moreover, in the multi-signal generator using this method, the production cost needs to be high because the frequency synthesizers with wide variable frequency range and the modulators of wide frequency range are needed for the number of channels of the multi-signals.

To solve this problem, it may be possible to limit the variable frequency range of the frequency synthesizers 11, 12 and 13 to a narrower range of, for instance, 800 MHz.

However, it is difficult to deal with different test situations where frequency bands of the communication devices to be tested are changed, for example to 1.5 GHz or 1.7 GHz.

Another conventional example of multi-signal generator using frequency conversion method is explained with reference to FIG. 6.

This example has a 3-channel configuration having fixed frequency synthesizers 16, 17, 28, 36, 37 and 38, modulators 21, 22 and 23, mixers 61, 62, 63, 66, 67 and 68, variable frequency synthesizers 41, 42 and 43, band pass filters 51, 52 and 53, amplifiers 71, 72 and 73, attenuators 81, 82 and 83, and an adder 90.

The operation of this generator is explained for an example wherein a frequency range of 0–2 GHz for a signal frequency f1 is to be generated.

In the channel 1, the carrier frequency of the fixed frequency synthesizer is set to, for example 200 MHz, which is modulated by the modulator 21.

The modulated signal from the modulator 21 and an oscillation frequency 3.8 GHz of the fixed frequency synthesizer 36 are frequency converted by the mixer 61, thereby producing an IF output of frequency 4 GHz which is the sum of the two frequencies.

The frequency 4 GHz and a frequency 4–6 GHz of the variable frequency synthesizer 41 are frequency converted by the mixer 66, thereby producing an output signal of frequency 0–2 GHz which is the difference between the two frequencies.

The output signal is amplified by the amplifier 71, and the amplitude of which is adjusted to a desired level by the attenuator 81.

Similar to the foregoing example, the outputs of channel 1, channel 2 and channel 3 are added by the adder 90, thereby producing the multi-signals having three different frequencies f1, f2 and f3 with the desired level within the frequency range of 0–2 GHz.

In this configuration, two stages of mixers are configured so that the pass band property of the band pass filters need not be sharp.

More specifically, spurious responses are produced at the output of the mixers because of mutual modulation.

To suppress the spurious response, each local frequency for each of the two mixer is determined in such a way that the spurious response will not be produced in the vicinity of the frequency of the signal to be used.

In this configuration, the calibration is easily carried out because the frequencies of the frequency synthesizers 16, 17 and 18 and modulators 21, 22 and 23 are fixed as well as they are low enough.

However, the wide and variable frequency range such as 4–6 GHz is necessary for the frequency synthesizers 41, 42 and 43. Thus, the overall cost becomes high because such wide range and high frequency synthesizers must be configured by using YIG oscillators.

Here, a YIG oscillator is an oscillator which can oscillate in a wide frequency range by controlling an exciting current for an electric magnet which creates a direct current magnetic field applied to a single YIG crystal sphere.

Moreover, the overall cost of the generator further increases because the wide range frequency synthesizers 41, 42 and 43 are required for all the channels in order to output the multi-signals.

As explained in the foregoing, in the multi-signal generator in the first conventional example, the method which combines the variable frequency synthesizers and the quadrature modulators has a disadvantage which requires a wide range calibration capability.

When the fixed frequency synthesizers are alternatively used, it is difficult to deal with the changes in the frequency range or band of the communication devices to be tested.

The multi-signal generator of the second example involves a disadvantage in that the overall cost increases because the frequency synthesizers 41, 42 and 43 with high and variable frequency in the range of 4–6 GHz are required corresponding to the number of channels.

The present invention has been made to solve these problems involved in the conventional technology. The purpose of the invention is to provide a multi-signal generator which is capable of decreasing the cost by performing the modulation at low frequencies as well as commonly using an output of a frequency synthesizer.

DISCLOSURE OF INVENTION

The first invention to achieve the above objectives is configured in the following:

A multi-signal generator for generating a multi-signal which is a combination of a plurality of output signals generated by a plurality of channels each of which is using a frequency conversion method wherein a modulated carrier signal and a local signal are frequency converted by a mixer, characterized in that:

an output frequency from at least one frequency synthesizer is commonly used as a frequency source for the carrier signal or local signal by all the channels.

As shown in FIG. 1, the second invention to achieve the above objectives is configured in the following:

A multi-signal generator for generating a multi-signal which is a combination of a plurality of output signals generated by a plurality of channels each of which is using a frequency conversion method wherein a modulated carrier signal and a local signal are frequency converted by a mixer, characterized in that:

a first frequency synthesizer 16 for generating a fixed frequency signal which is commonly used by all the channels;

second frequency synthesizers 31, 32 and 33 for generating fixed frequency signals which are separately used by corresponding channels;

a third frequency synthesizer 41 for generating a variable frequency signal which is commonly used by all the channels;

wherein one of the channels of the signal generator for generating a frequency signal f1 comprising:

a modulator 21 for modulating the signal from the first frequency synthesizer 16;

a first mixer 61 for frequency converting an output signal of the modulator 21 and the output signal of the second frequency synthesizer 31;

a band pass filter 51 for transmitting therethrough a predetermined frequency in an output signal of the first mixer 61;

a second mixer 66 for frequency converting an output signal of the band pass filter 51 and the output signal of the third frequency synthesizer 41 for generating the resultant frequency signal f1;

thereby generating the multi-signal having the plural channels of frequencies f1, f2 and f3.

As shown in FIG. 2, the third invention to achieve the above objectives is configured in the following:

A multi-signal generator for generating a multi-signal which is a combination of a plurality of output signals generated by a plurality of channels each of which is using a frequency conversion method wherein a modulated carrier signal and a local signal are frequency converted by a mixer, characterized in that:

first frequency synthesizers 11, 12 and 13 separately provided in the corresponding channels for generating variable frequency signals fa, fb and fc;

a second frequency synthesizer 40 for generating a fixed frequency signal which is commonly used by all the channels;

wherein one of the channels of the signal generator for generating a frequency signal f1 comprising:

a modulator 21 for modulating the signal from the first frequency synthesizer 11;

a mixer 61 for frequency converting an output signal of the modulator 21 and the output signal of the second frequency synthesizer 40;

a band pass filter 51 for transmitting therethrough a predetermined frequency f1 in an output signal of the first mixer 61;

thereby generating the multi-signal having the plural channels of frequencies f1, f2 and f3.

As shown in FIG. 3, the fourth invention to achieve the above objectives is configured in the following:

A multi-signal generator for generating a multi-signal which is a combination of a plurality of output signals generated by a plurality of channels each of which is using a frequency conversion method wherein a modulated carrier signal and a local signal are frequency converted by a mixer, characterized in that:

a first frequency synthesizer 11 for generating a fixed frequency signal fd which is commonly used by all the channels;

second frequency synthesizers 31, 32 and 33 separately provided in the corresponding channels for generating fixed frequency signals;

wherein one of the channels of the signal generator for generating a frequency signal f1 comprising:

a modulator 21 for modulating the signal from the first frequency synthesizer 11;

a mixer 61 for frequency converting an output signal of the modulator 21 and the output signal of the second frequency synthesizer 31 for producing the frequency converted signal f1;

a band pass filter 51 for transmitting therethrough the predetermined frequency f1 in the output signal of the first mixer 61;

thereby generating the multi-signal having the plural channels of frequencies f1, f2 and f3.

BEST MODE FOR CARRYING OUT THE INVENTION

The first embodiment of the multi-signal generator in the present invention is explained with reference to FIG. 1 and FIG. 4.

Figure 1:
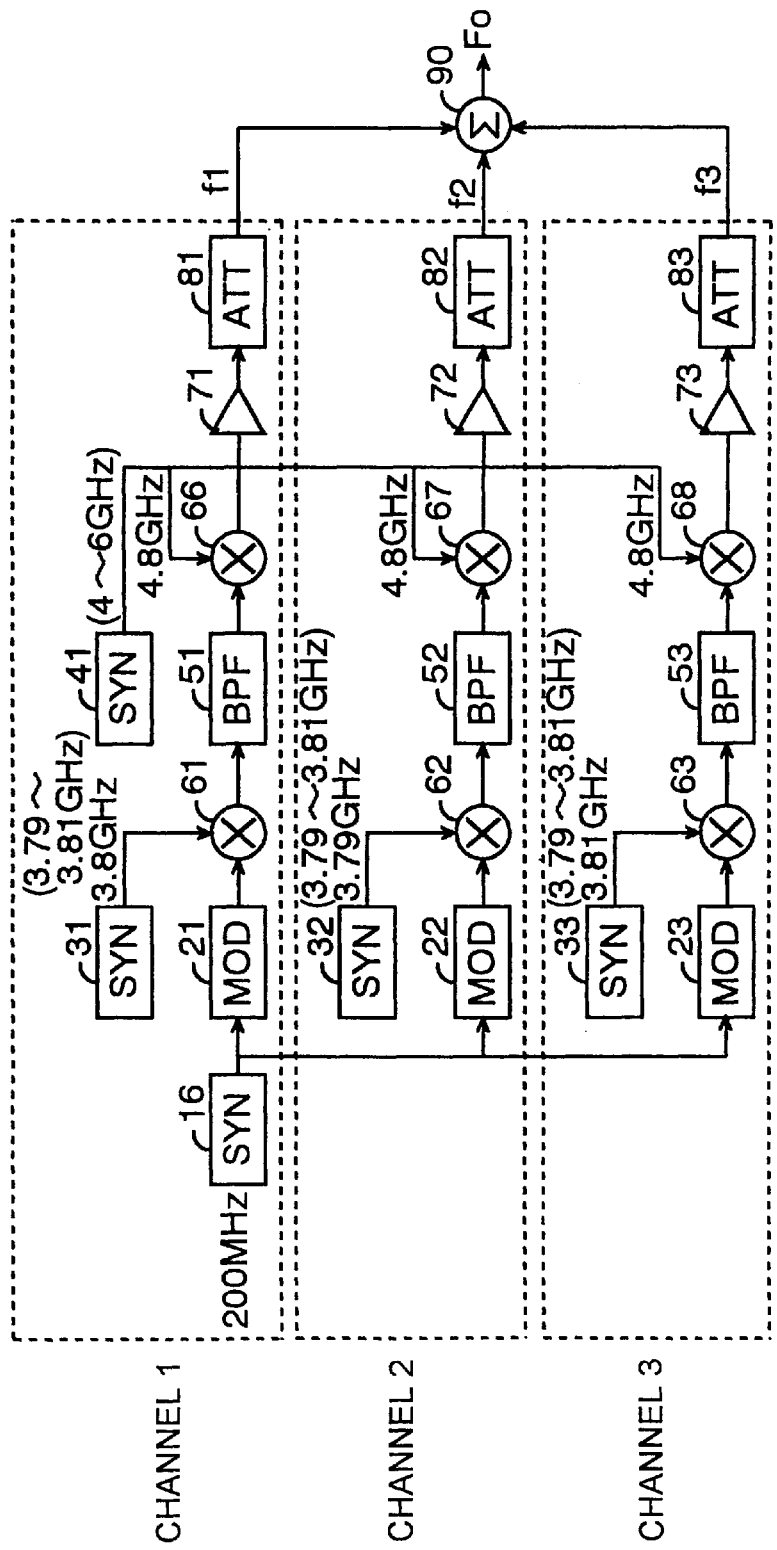
FIG. 1 is a block diagram showing a first embodiment of the multi-signal generator in the present invention.

As shown in FIG. 1, the first embodiment of the multi-signal generator is configured with three (3) channels. The multi-signal generator includes a fixed frequency synthesizer 16, modulators 21, 22 and 23, mixers 61, 62, 63, 66, 67 and 68, band pass filters 51, 52 and 53, frequency synthesizers 31, 32 and 33 of narrow variable frequency range, a frequency synthesizer 41 of wide variable frequency range, amplifiers 71, 72 and 73, attenuators 81, 82 and 83, and an adder 90.

In the first embodiment, the output of the fixed frequency synthesizer 16 and the output of the wide variable frequency range synthesizer 41 are commonly used for all of the channels.

In the following, it is assumed, for example, that the frequency generated by the fixed frequency synthesizer 16 is 200 MHz, and the frequencies generated by the narrow band variable frequency range synthesizer 31, 32 and 33 are 3.79 GHz, 3.80 GHz and 3.81 GHz, respectively. It is also assumed that the frequency range of the wide variable frequency range synthesizer 41 is in the range of 4–6 GHz.

In general, test items of receivers in a mobile communication system include mono-tone sensitivity suppression test and mutual modulation spurious responses reduction test. Test items of amplifiers and mixers include two-tone test.

The mono-tone sensitivity suppression is a test for evaluating a degree of existence of a mono-tone signal, i.e., a single frequency signal in a certain frequency offset from a center frequency of an allocated carrier signal. The mono-tone sensitivity suppression can show a degree of ability for the receiver to receive a signal in the allocated channel.

For performing the mono-tone sensitivity suppression test, a multi-signal generator has to provide two channel signals, one signal having a frequency which is a center of the allocated channel and the other signal having an offset frequency from the center frequency.

This test can be carried out by using the multi-signal having a plurality of frequencies which are different several 10 MHz from one another.

Figure 4:
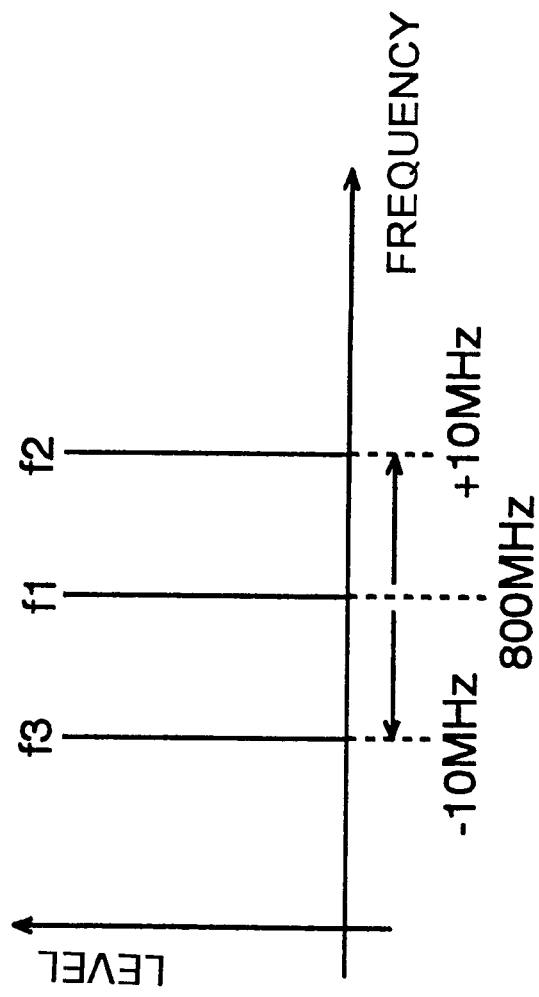
FIG. 4 is a schematic diagram showing frequency spectrum of a multi-signal.
Figure 5:
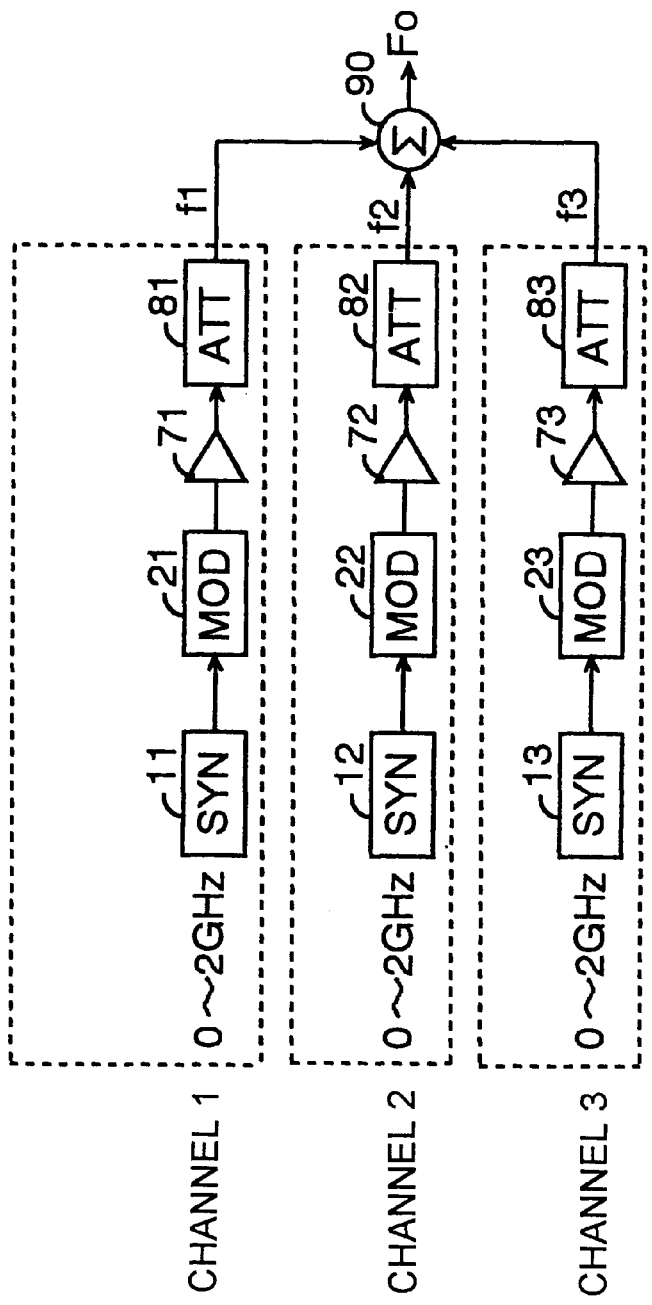
FIG. 5 is a block diagram showing a first example of the multi-signal generator in the prior art.
Figure 6:
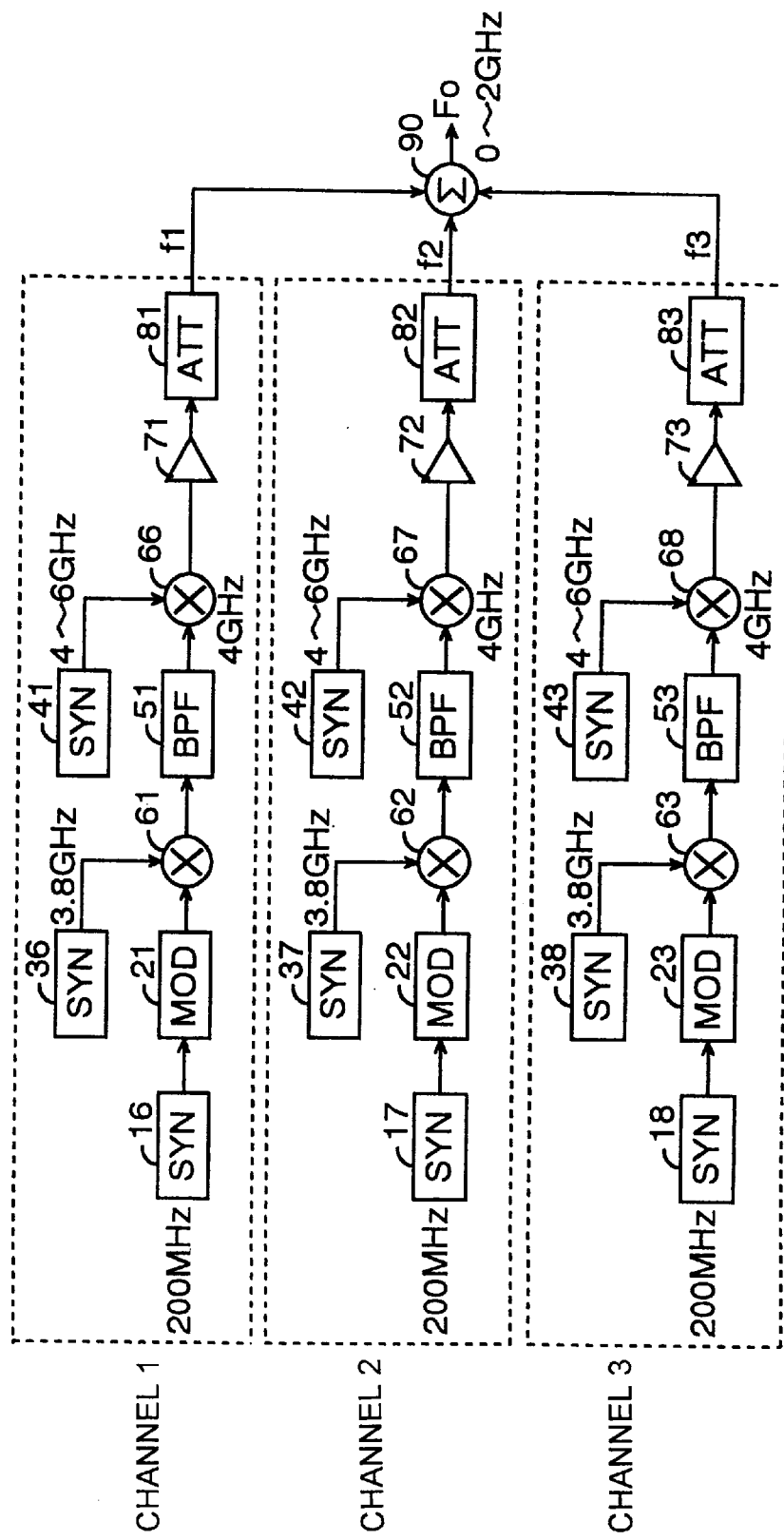
FIG. 6 is a block diagram showing a second example of the multi-signal generator in the prior art.

Therefore, as shown in FIG. 4, the operation of this embodiment is explained in the situation wherein three channels of multi-signals having center frequencies of 800 MHz and 800 MHz±10 MHz, respectively, are generated.

As shown in FIG. 1, the channel 1 utilizes a carrier signal whose frequency is 200 MHz which is generated by the fixed frequency synthesizer 16. The carrier signal is modulated by the modulator 21 and then, frequency converted by the mixer 61 with the frequency 3.8 GHz generated by the narrow variable range frequency synthesizer 31.

The resultant IF signal frequency 4 GHz from the mixer 61, which is the sum of the two frequencies, passes through the band pass filter 51.

The 4 GHz IF signal and the frequency 4.8 GHz generated by the variable frequency synthesizer 41 are frequency converted by the mixer 66, thereby producing a frequency f1=800 MHz, which is the difference between the two frequencies.

The output signal f1 is amplified by the amplifier 71, and is attenuated to a desired level by the attenuator 81 to be input to the adder 90. similarly, with respect to the channel 2, the output frequency of the narrow range variable frequency synthesizer 32 is set to 3.79 GHz, and the resultant frequency f2=810 MHz is input to the adder 90.

Similarly, with respect to the channel 3, the output frequency of the narrow range variable frequency synthesizer 32 is set to 3.81 GHz, and the resultant frequency f3=790 MHz is input to the adder 90.

The frequencies f1, f2 and f3 are combined in the adder 90, thereby producing multi-signals of desired levels having frequencies 790 MHz, 800 MHz and 810 MHz, respectively.

In the configuration of this embodiment, the output frequency of the variable frequency synthesizer 41 is commonly used in the three channels. Because of the frequency range of the variable frequency synthesizer 41, the output frequencies of the multi-signal generator can be freely set within the range of 0–2 GHz.

Therefore, the multi-signal generator of this embodiment can be used for testing receivers used in communication systems whose frequency bands are different from the above, such as 1.5 GHz, 1.7 GHz or 1.9 GHz, without changing the channel structure therein.

The frequency differences in the output multi-signals are freely set by the narrow range variable frequency synthesizers 31, 32 and 33.

Figure 2:
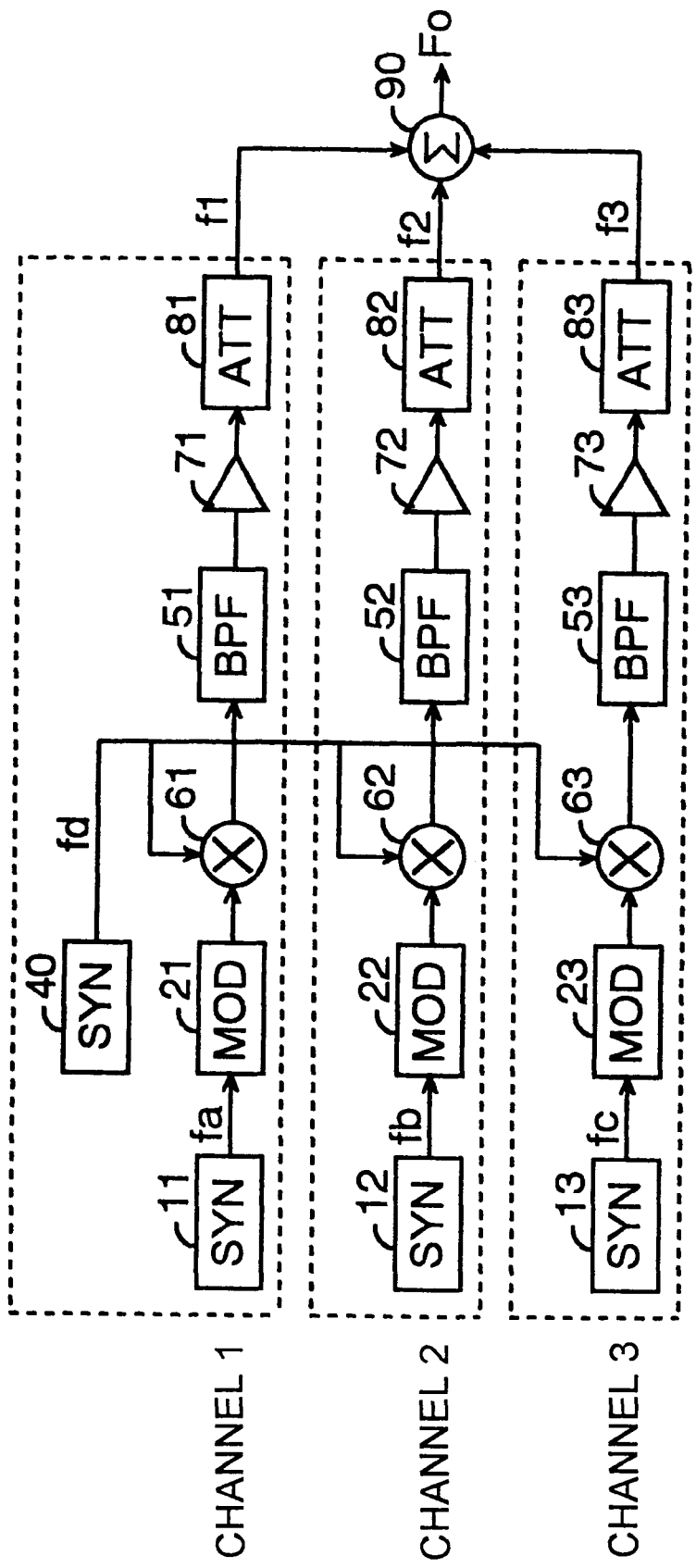
FIG. 2 is a block diagram showing a second embodiment of the multi-signal generator in the present invention.

The second embodiment of the multi-signal generator in the present invention is explained with reference to FIG. 2 for testing fixed frequency band receivers.

The multi-signal generator in the second embodiment includes narrow band variable frequency synthesizers 11, 12 and 13, a fixed frequency synthesizer 40, modulators 21, 22 and 23, mixers 61, 62 and 63, band pass filters 51, 52 and 53, amplifiers 71, 72 and 73, attenuators 81, 82 and 83, and an adder 90.

In this example, since the output frequency band is fixed, each channel of the multi-signal generator can be configured by a single stage mixer.

The operation of the multi-signal generator in the second embodiment is explained in the following:

In the channel 1, a frequency fa generated by the frequency synthesizer 11 is modulated by the modulator 21 and then mixed with an output frequency fd of the frequency synthesizer 40 by the mixer 61, thereby producing the sum and difference between the two frequencies, i.e., frequencies fa+fd and fa−fd.

Either one of the IF outputs, which is selected from the frequency sum fa+fd or frequency difference fa−fd, is allowed to pass through the band pass filter 51, and the signal of frequency f1 is output therefrom.

Then, the output signal f1 is amplified by the amplifier 71, and is attenuated to a desired level by the attenuator 81 to be input to the adder 90.

Similarly, with respect to the channel 2, a signal frequency f2 is input to the adder 90.

In the similar manner, with respect to the channel 3, a signal frequency f3 is input to the adder 90.

Then, signal frequencies f1, f2 and f3 are combined by the adder 90, resulting in the multi-signals for a fixed frequency band with desired voltage levels.

Figure 3:
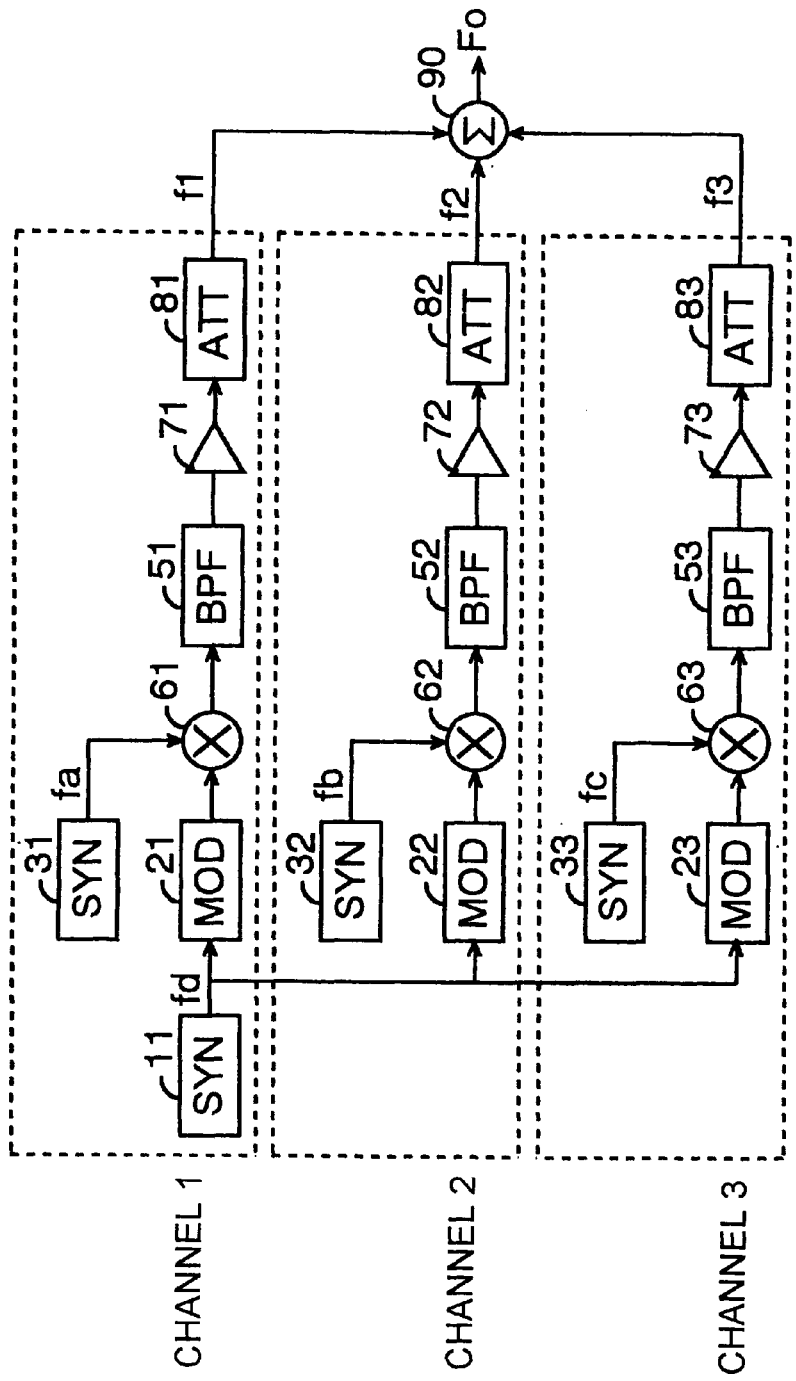
FIG. 3 is a block diagram showing a third embodiment of the multi-signal generator in the present invention.

The multi-signal generator in the third embodiment is explained with reference to FIG. 3 for the example which generates three channel multi-signals.

The third embodiment includes a fixed frequency synthesizer 11, narrow variable range frequency synthesizers 31, 32 and 33, modulators 21, 22 and 23, mixers 61, 62 and 63, band pass filters 51, 52 and 53, amplifiers 71, 72 and 73, attenuators 81, 82 and 83, and an adder 90.

Contrast to the second embodiment, in the third embodiment 3, a carrier frequency common to all the channels generated by the fixed frequency synthesizer is provided to the modulators, and the modulated carrier signals are frequency converted with the use of outputs of variable frequency synthesizers.

Accordingly, the output of the mixer 61 in the channel 1 includes a frequency sum fd+fa and a frequency difference fd−fa.

Either one of the IF outputs, which is selected from the frequency sum fa+fd or frequency difference fa−fd, is allowed to pass through the band pass filter 51, and the signal frequency f1 is output therefrom.

Then, the output signal frequency f1 is amplified by the amplifier 71, and is attenuated to a desired level by the attenuator 81 to be input to the adder 90.

Signal frequencies f2 and f3 in the channels 2 and 3 are obtained in the similar manner, thus, explanation of the operations are not provided here.

Then, signal frequencies f1, f2 and f3 are combined by the adder 90, resulting in the multi-signals for a fixed frequency band with desired voltage levels.

In the foregoing, although the first to third embodiments are explained for the case wherein the multi-signal generator includes three channels. However, the present invention can be equally applicable to a multi-signal generator having two channels, four or more channels.

In the embodiments above, the fixed frequency synthesizers can be replaced with oscillators of corresponding fixed frequencies.

Industrial Applicability

Since the present invention is configured as explained above, it has the following effects.

Simply-configured and inexpensive modulators can be used since the modulators are used for carrier signals with a fixed frequency or narrow range frequencies.

The multi-signal generator can be achieved with low cost since the output frequencies of the wide variable range frequency synthesizer can be used commonly to all the channels, and the frequency band of the multi-signals can be freely set within the variable frequency range.

A simple and inexpensive implementation of the multi-signal generator is achieved for the fixed frequency band because the frequency synthesizer generating local or carrier signals can be used commonly to all the channels.

What is claimed is:

1. A multi-signal generator for generating a multi-signal which is a combination of a plurality of output signals generated by a plurality of channels each of which is using a frequency conversion method wherein a modulated carrier signal and a local signal are frequency converted by a mixer, characterized in that:

an output frequency from at least one frequency synthesizer is commonly used as a frequency source for the carrier signal or local signal by all the channels.

2. A multi-signal generator for generating a multi-signal which is a combination of a plurality of output signals generated by a plurality of channels each of which is using a frequency conversion method wherein a modulated carrier signal and a local signal are frequency converted by a mixer, characterized in that:

a first frequency synthesizer (16) for generating a fixed frequency signal which is commonly used by all the channels;

second frequency synthesizers (31, 32, 33) for generating fixed frequency signals which are separately used by corresponding channels;

a third frequency synthesizer (41) for generating a variable frequency signal which is commonly used by all the channels;

wherein one of the channels of the signal generator for generating a frequency signal (f1) comprising:

a modulator (21) for modulating the signal from the first frequency synthesizer (16);

a first mixer (61) for frequency converting an output signal of the modulator (21) and the output signal of the second frequency synthesizer (31);

a band pass filter (51) for transmitting therethrough a predetermined frequency in an output signal of the first mixer (61);

a second mixer (66) for frequency converting an output signal of the band pass filter (51) and the output signal of the third frequency synthesizer (41) for generating the resultant frequency signal (f1);

thereby generating the multi-signal having the plural channels of frequencies (f1, f2, f3).

3. A multi-signal generator for generating a multi-signal which is a combination of a plurality of output signals generated by a plurality of channels each of which is using a frequency conversion method wherein a modulated carrier signal and a local signal are frequency converted by a mixer, characterized in that:

first frequency synthesizers (11, 12, 13) separately provided in the corresponding channels for generating variable frequency signals (fa, fb, fc);

a second frequency synthesizer (40) for generating a fixed frequency signal which is commonly used by all the channels;

wherein one of the channels of the signal generator for generating a frequency signal (f1) comprising:

a modulator (21) for modulating the signal from the first frequency synthesizer (11);

a mixer (61) for frequency converting an output signal of the modulator (21) and the output signal of the second frequency synthesizer (40);

a band pass filter (51) for transmitting therethrough a predetermined frequency (f1) in an output signal of the first mixer (61);

thereby generating the multi-signal having the plural channels of frequencies (f1, f2, f3).

4. A multi-signal generator for generating a multi-signal which is a combination of a plurality of output signals generated by a plurality of channels each of which is using a frequency conversion method wherein a modulated carrier signal and a local signal are frequency converted by a mixer, characterized in that:

a first frequency synthesizer (11) for generating a fixed frequency signal (fd) which is commonly used by all the channels;

second frequency synthesizers (31, 32, 33) separately provided in the corresponding channels for generating fixed frequency signals;

wherein one of the channels of the signal generator for generating a frequency signal (f1) comprising:

a modulator (21) for modulating the signal from the first frequency synthesizer (11);

a mixer (61) for frequency converting an output signal of the modulator (21) and the output signal of the second frequency synthesizer (31) for producing the frequency converted signal (f1);

a band pass filter (51) for transmitting therethrough the predetermined frequency (f1) in the output signal of the first mixer (61);

thereby generating the multi-signal having the plural channels of frequencies (f1, f2, f3).

5. A multi-signal generator as defined in any one of claims 2–4, wherein the frequency synthesizer for generating the fixed frequency signal is an oscillator which oscillates at a fixed frequency.

* * * * *